United States Patent
Schulze et al.

(10) Patent No.: US 9,647,100 B2
(45) Date of Patent: May 9, 2017

(54) SEMICONDUCTOR DEVICE WITH AUXILIARY STRUCTURE INCLUDING DEEP LEVEL DOPANTS

(71) Applicant: Infineon Technologies AG, Neubiberg (DE)

(72) Inventors: Hans-Joachim Schulze, Taufkirchen (DE); Christian Jaeger, Munich (DE); Franz Josef Niedernostheide, Hagen a. T.W. (DE); Roman Baburske, Otterfing (DE); Andre Rainer Stegner, Munich (DE); Antonio Vellei, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/887,520

(22) Filed: Oct. 20, 2015

(65) Prior Publication Data
US 2016/0111528 A1    Apr. 21, 2016

(30) Foreign Application Priority Data
Oct. 21, 2014  (DE) .......................... 10 2014 115 303

(51) Int. Cl.
*H01L 29/00* (2006.01)
*H01L 29/739* (2006.01)
(Continued)

(52) U.S. Cl.
CPC ...... *H01L 29/7395* (2013.01); *H01L 29/0607* (2013.01); *H01L 29/0696* (2013.01);
(Continued)

(58) Field of Classification Search
CPC .......... H01L 29/7395; H01L 29/66333; H01L 29/0821; H01L 29/167; H01L 29/0813;
(Continued)

(56) References Cited

U.S. PATENT DOCUMENTS

| 9,269,769 B2 * | 2/2016 | Schulze | .............. H01L 29/0692 |
| 2009/0140290 A1 * | 6/2009 | Schulze | .............. H01L 29/0692 257/162 |
| 2013/0234201 A1 | 9/2013 | Xiao | |

FOREIGN PATENT DOCUMENTS

| DE | 10 2012 102 341 A1 | 10/2012 |
| DE | 10 2012 109 902 A1 | 4/2013 |
| DE | 10 2007 057 728 B4 | 4/2014 |

OTHER PUBLICATIONS

Office Action Communication of the German Patent and Trademark Office for File Reference 102014115303.0 dated Oct. 21, 2014.

* cited by examiner

*Primary Examiner* — Nikolay Yushin
(74) *Attorney, Agent, or Firm* — Baker Botts L.L.P.

(57) ABSTRACT

A semiconductor device includes transistor cells formed along a first surface at a front side of a semiconductor body in a transistor cell area. A drift zone structure forms first pn junctions with body zones of the transistor cells. An auxiliary structure between the drift zone structure and a second surface at a rear side of the semiconductor body includes a first portion that contains deep level dopants requiring at least 150 meV to ionize. A collector structure directly adjoins the auxiliary structure. An injection efficiency of minority carriers from the collector structure into the drift zone structure varies along a direction parallel to the first surface at least in the transistor cell area.

25 Claims, 17 Drawing Sheets

(51) Int. Cl.
*H01L 29/06* (2006.01)
*H01L 29/08* (2006.01)
*H01L 29/167* (2006.01)
*H01L 29/66* (2006.01)
*H01L 29/36* (2006.01)
*H01L 29/10* (2006.01)

(52) U.S. Cl.
CPC ...... *H01L 29/0813* (2013.01); *H01L 29/0821* (2013.01); *H01L 29/0834* (2013.01); *H01L 29/167* (2013.01); *H01L 29/36* (2013.01); *H01L 29/66333* (2013.01); *H01L 29/1095* (2013.01)

(58) Field of Classification Search
CPC ............. H01L 29/1095; H01L 29/0696; H01L 29/0607
See application file for complete search history.

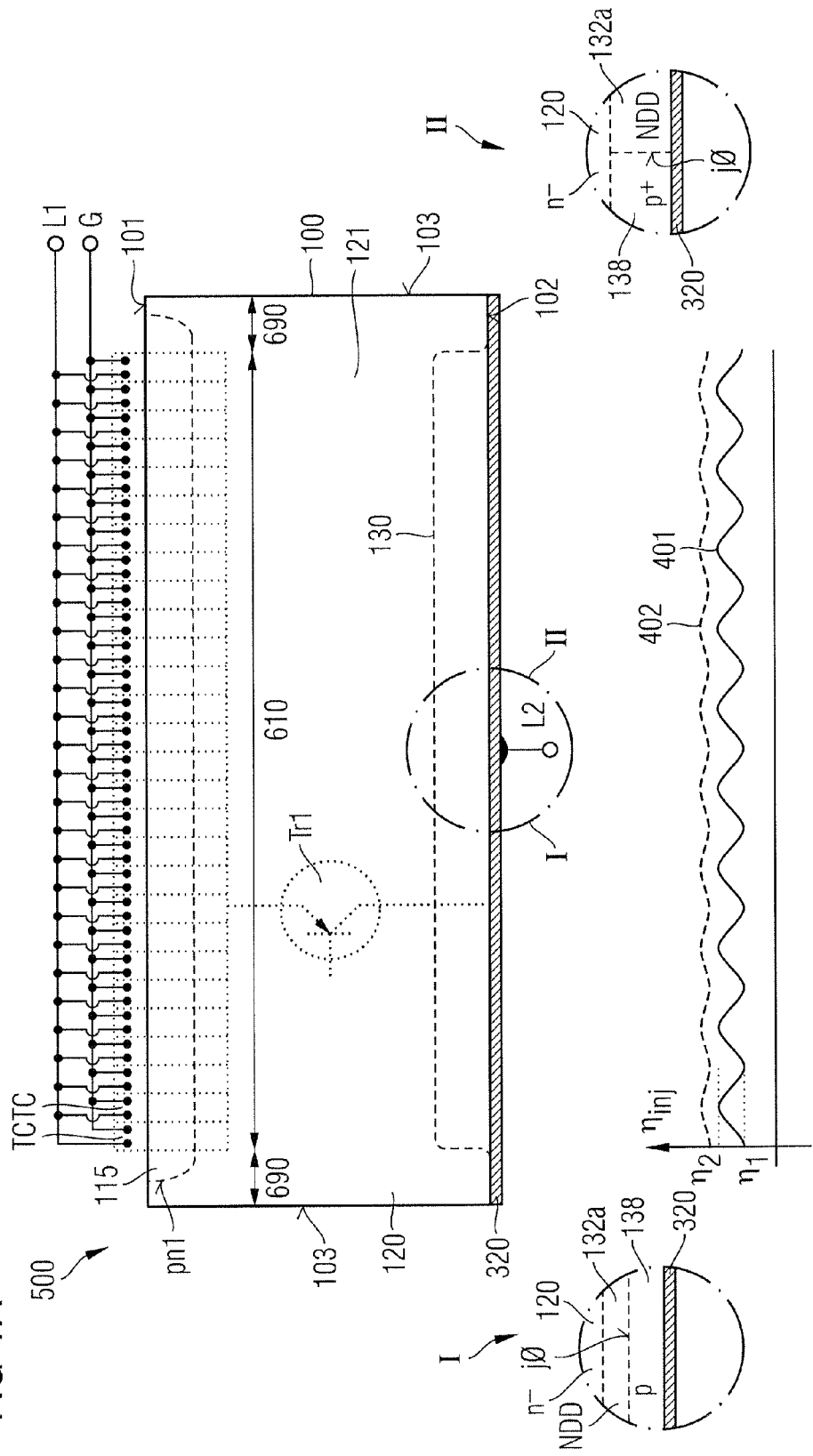

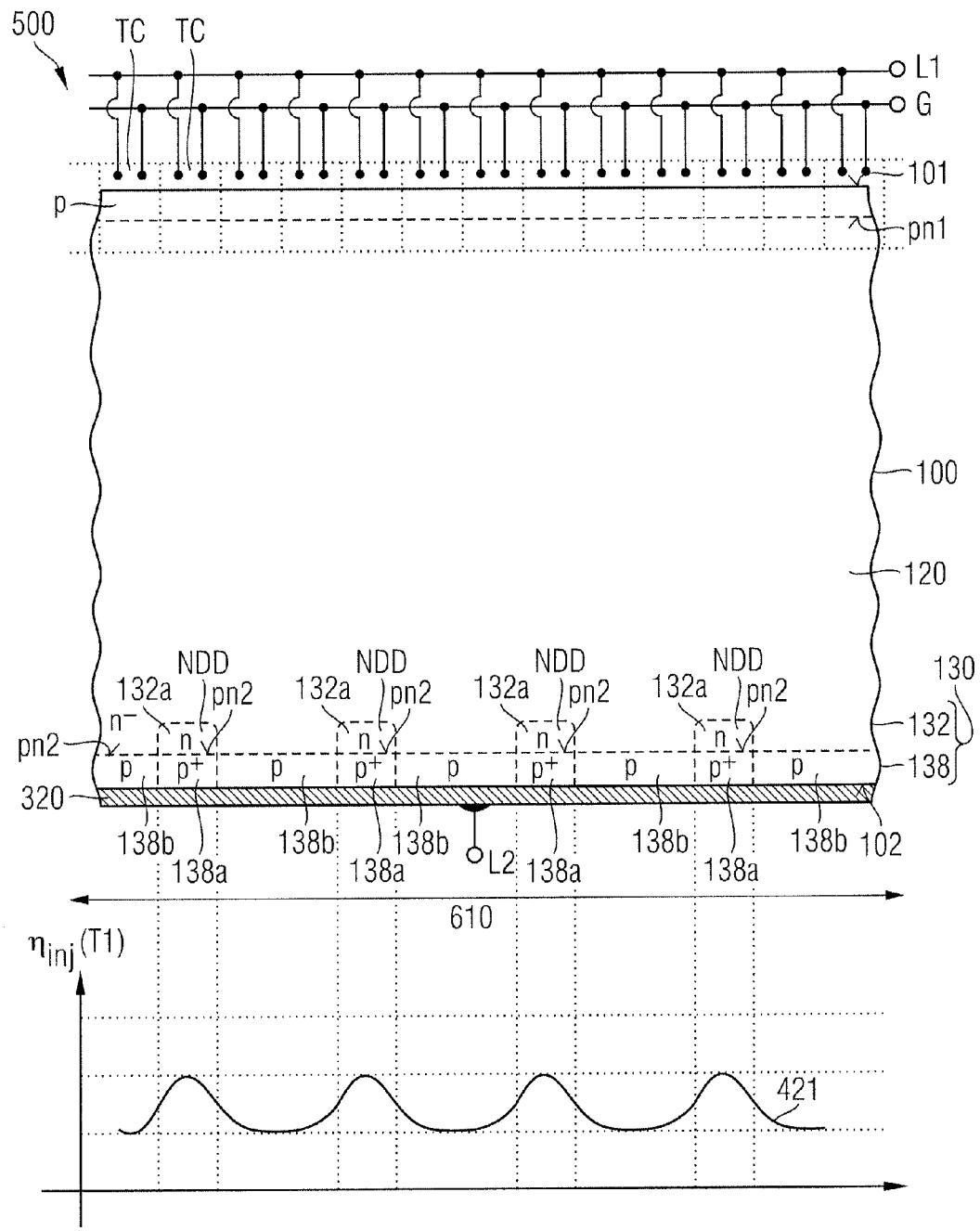

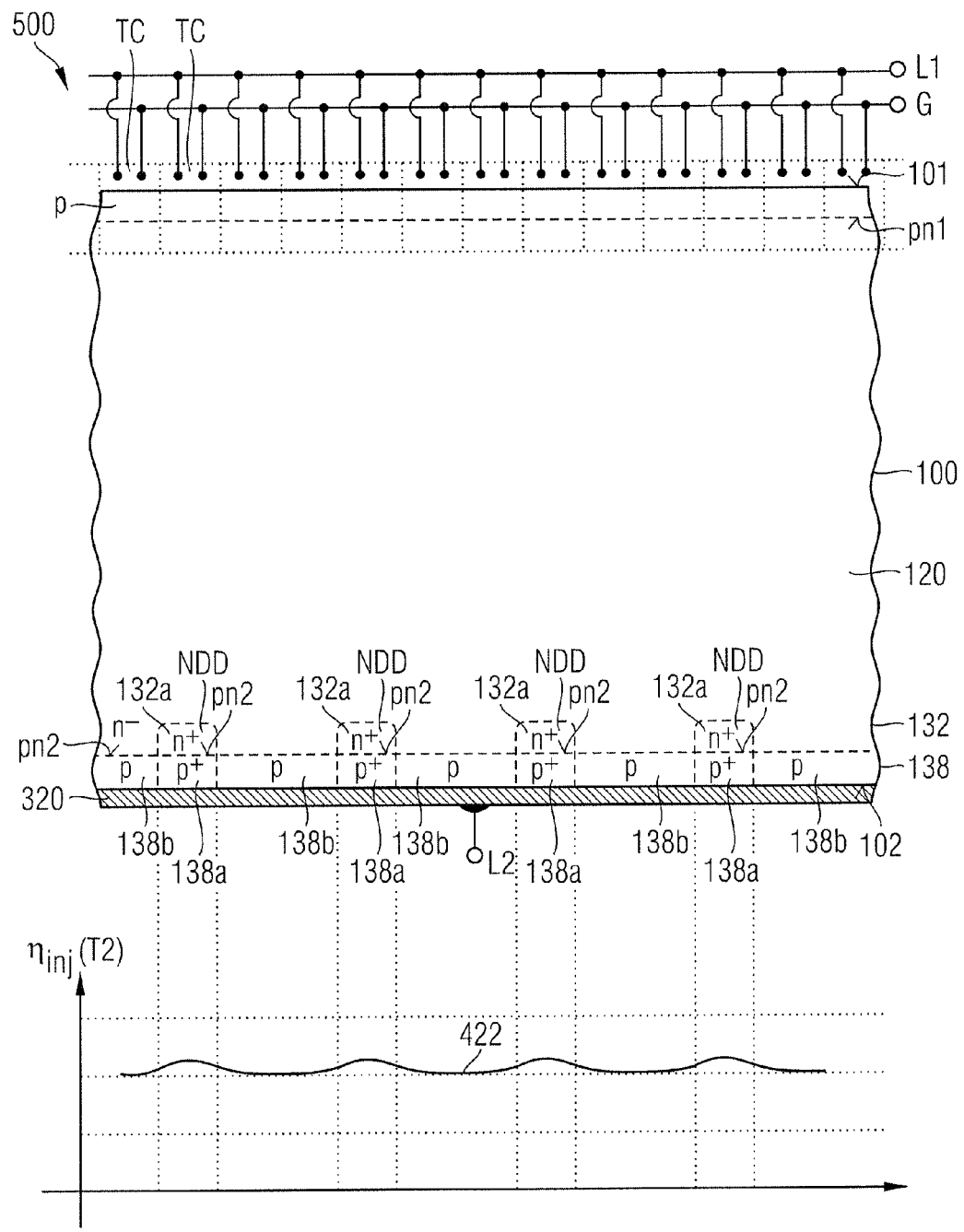

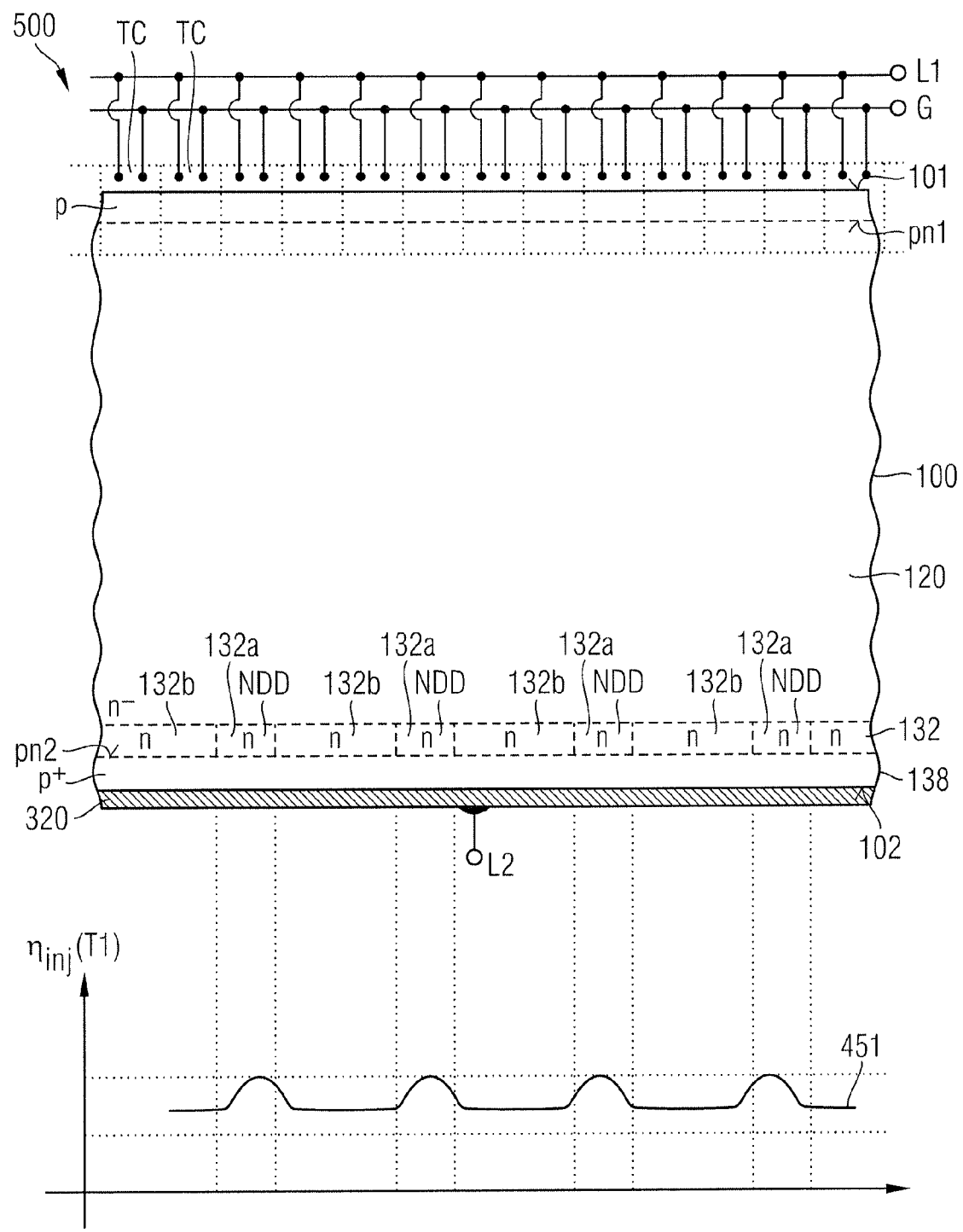

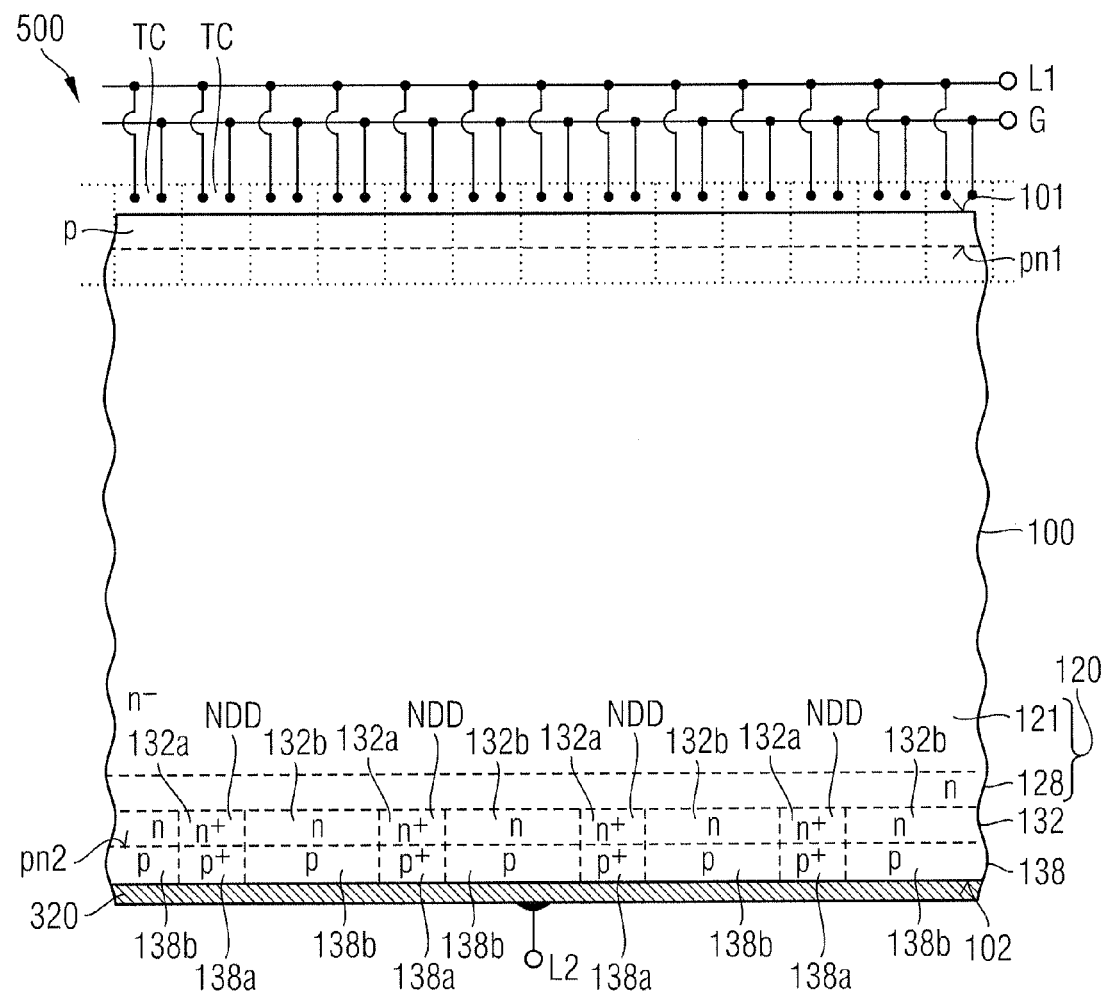

SEMICONDUCTOR DEVICE WITH AUXILIARY STRUCTURE INCLUDING DEEP LEVEL DOPANTS

CROSS REFERENCE TO RELATED APPLICATION

This application claims priority to German Application Serial No. 102014115303.0 filed Oct. 21, 2014 and entitled "Semiconductor Device With Auxiliary Structure Including Deep Level Dopants".

BACKGROUND

Typical specification parameters of power semiconductor devices such as IGBTs (insulated gate bipolar transistors) concern blocking capability, static losses, switching losses, switching softness as well as short circuit ruggedness. Improving one of these device characteristics usually adversely affects at least one of the other device characteristics.

It is desirable to provide semiconductor devices with high switching softness and high short circuit ruggedness.

SUMMARY

According to an embodiment a semiconductor device includes transistor cells which are formed along a first surface at a front side of a semiconductor body in a transistor cell area. A drift zone structure forms first pn junctions with body zones of the transistor cells. At least a first portion of an auxiliary structure between the drift zone structure and a second surface at the rear side of the semiconductor body contains deep level dopants requiring at least 150 meV to ionize. A collector structure directly adjoins the auxiliary structure. An injection efficiency of minority carriers from the collector structure into the drift zone structure varies along a direction parallel to the first surface at least in the transistor cell area.

According to another embodiment an insulated gate bipolar transistor includes transistor cells which are formed along a first surface at a front side of a semiconductor body in a transistor cell area. A drift zone structure forms first pn junctions with body zones of the transistor cells. At least a first portion of an auxiliary structure between the drift zone structure and a second surface at the rear side of the semiconductor body contains deep level dopants requiring at least 150 meV to ionize. A collector structure directly adjoins the auxiliary structure. An injection efficiency of minority carriers from the collector structure into the drift zone structure varies along a direction parallel to the first surface at least in the transistor cell area.

According to a further embodiment, a method of manufacturing a semiconductor device includes forming transistor cells at a front side of a semiconductor body, wherein a drift zone formed in the semiconductor body is effective as drain of the transistor cells. At a rear side of the semiconductor body, a rear side structure is formed that includes deep level dopants requiring at least 150 meV to ionize. A minority carrier injection efficiency into the drift zone varies along a direction parallel to the second surface at least in a transistor cell area.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1A is a simplified vertical cross-sectional view of a portion of a semiconductor device according to an embodiment including a collector structure and an auxiliary structure that form a rear side structure with laterally varying injection efficiency.

FIG. 2A is a schematic vertical cross-sectional view of a portion of a semiconductor device in accordance with an embodiment with horizontally patterned auxiliary and collector structures, at a first temperature T1.

FIG. 2B illustrates the semiconductor device portion of FIG. 2A at a second temperature T2 higher than T1.

FIG. 5A is a schematic cross-sectional view of a portion of semiconductor device in accordance with an embodiment concerning a horizontally patterned auxiliary structure and a non-patterned collector layer at a first temperature T1.

FIG. 7 is a schematic vertical cross-sectional view of a portion of semiconductor device according to an embodiment with an additional field stop zone.

DETAILED DESCRIPTION

Figure 1B:
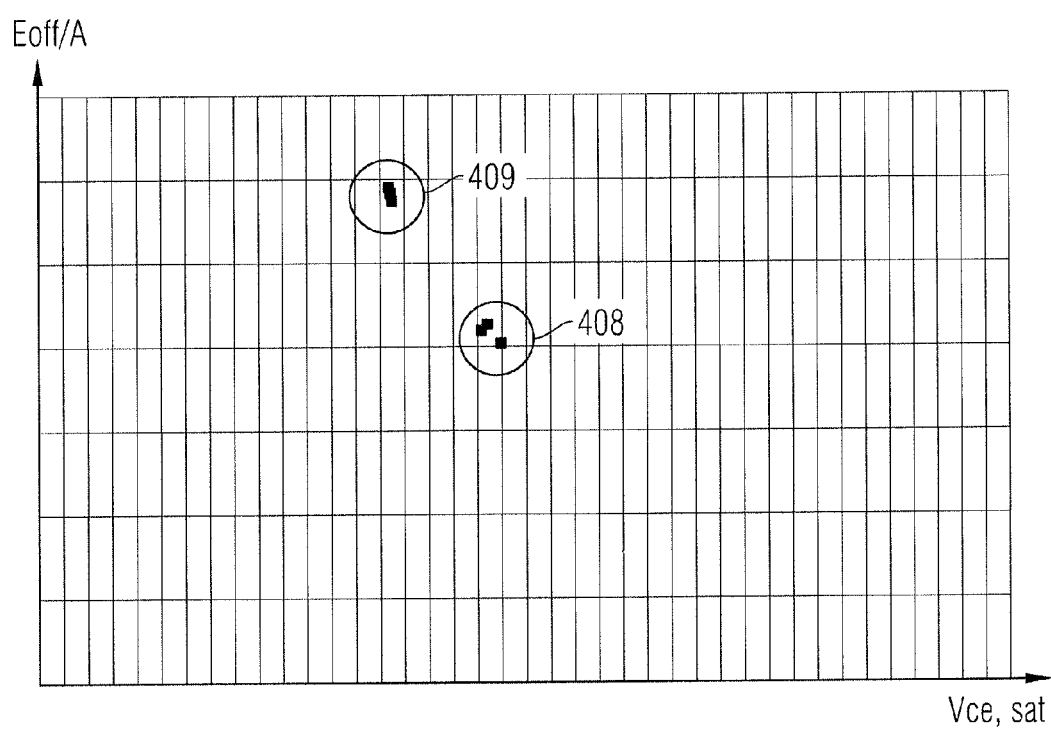
FIG. 1B is a diagram for illustrating effects of the embodiments.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" indicates a doping concentration which is lower than the doping concentration of an "n"-doping region, whereas an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

FIG. 1A refers to a semiconductor device 500, e.g., a semiconductor switching device including a plurality of identical transistor cells. The semiconductor device 500 may be or may include a power semiconductor switching device, for example an IGBT or a power semiconductor diode such as an MGD (MOS-gated diode).

The semiconductor device 500 is based on a semiconductor body 100 from a single crystalline semiconductor material such as silicon (Si), silicon carbide (SiC), germanium (Ge), a silicon germanium crystal (SiGe), gallium nitride (GaN), gallium arsenide (GaAs) or any other $A_{III}B_V$ semiconductor.

The semiconductor body 100 has a first surface 101 which may be approximately planar or which may be defined by a plane spanned by coplanar surface sections. A planar second surface 102 extends parallel to the first surface 101. A distance between the first and second surfaces 101, 102 is a function of a voltage blocking capability of the semiconductor device 500 and may be at least 20 μm. According to other embodiments, the distance may be in the range of several hundred μm. A side surface 103, which is tilted to the first and second surfaces 101, 102, connects the first and second surfaces 101, 102.

In a plane parallel to the first surface 101 the semiconductor body 100 may have an approximately rectangular shape with an edge length of several millimeters, wherein the corners may be rounded. A normal to the first surface 101 defines a vertical direction and directions orthogonal to the vertical direction are horizontal directions.

The semiconductor device 500 is a vertical device with a load current flow between the first surface 101 at the front side and the opposite second surface 102 at the rear side of the semiconductor device 500.

Transistor cells TC are formed along the first surface 101 at the front side in a transistor cell area 610. An edge area 690, which is devoid of operational transistor cells TC, surrounds the transistor cell area 610 and directly adjoins the lateral surface 103. The transistor cells TC may directly adjoin to each other. According to other embodiments idle areas, idle cells, desaturation cells and/or enhancement cells may be formed between neighboring transistor cells TC.

The transistor cells TC may be IGFET (insulated gate field effect transistor) cells with body zones 115 that form first pn junctions pn1 with a drift zone structure 120 in the semiconductor body 100 and further pn junctions with source zones of the transistor cells TC. The source zones are electrically connected or coupled to a first load terminal L1 of the semiconductor device 500. Portions of the drift zone structure 120 along the first pn junctions pn1 are effective as drain zones of the IGFET cells. Gate electrodes of the IGFET cells are capacitively coupled to the body zones 115. When a gate potential at the gate electrodes exceeds/falls below a predetermined threshold, an inversion channel of minority charge carriers in the body zone 115 of the respective transistor cell TC electrically connects the source zone of the transistor cell TC with the drift zone structure 120.

According to embodiments related to IGBTs, the gate electrodes of the transistor cells TC are electrically connected or coupled to a gate terminal G of the semiconductor device 500. According to embodiments referring to MGDs the gate electrodes of the transistor cells TC may be electrically connected or coupled to the first load terminal L1.

The drift zone structure 120 includes a drift zone 121 of a first conductivity type, wherein a mean net dopant concentration in the drift zone 121 may be between 1E13 cm$^{-3}$ and 1E17 cm$^{-3}$, e.g., in a range from 2E13 cm$^{-3}$ to 1E16 cm$^{-3}$ or from 3E13 cm$^{-3}$ to 3E14 cm$^{-3}$. The mean net dopant concentration in the drift zone 121 may be uniform or may gradually or in steps increase or decrease with increasing distance to the first surface 101. The drift zone structure 120 may include further doped regions, e.g., a buffer layer or a field stop zone between the drift zone 121 and a rear side structure 130, wherein a mean net dopant concentration in the field stop zone is at least twice as high as a mean net dopant concentration in the drift zone 121.

The transistor cells TC may be lateral transistor cells with the gate electrodes formed outside the outline of the semiconductor body 100 or may be vertical transistor cells with the gate electrodes formed in gate trenches extending from the first surface 101 into the semiconductor body 100. Between the first surface 101 and the drift zone structure 120 the semiconductor body 100 may include further structures such as floating doped regions, barrier layers and/or field electrodes, wherein the further conductive structures may electrically float or may be electrically connected to the first load terminal L1, by way of example.

The rear side structure 130 includes a collector structure 138 of a second conductivity type complementary to the conductivity type of the drift zone 121. The collector structure 138 directly adjoins the second surface 102 as well as an auxiliary structure between the drift zone structure 120 and the second surface 102. The body zones 115, the drift zone structure 120 and the collector structure 138 form an intrinsic bipolar junction transistor Tr1.

The auxiliary structure directly adjoins the drift zone structure 120 and may be a non-patterned contiguous layer with uniform dopant concentration along the horizontal directions or may be patterned with varying dopant concentration along at least one horizontal direction. One or more first portions 132a of the auxiliary structure contain deep level dopants NDD that require at least 150 meV, e.g., at least 200 meV to ionize, which means that the distance between the respective dopant level and the band gap edge is at least 150 meV, e.g., at least 200 meV. The electrically active (effective) dopant concentration in the first portions 132a of the auxiliary structure 132 increases with increasing temperature. For example, the effective dopant concentration at a reference temperature of 100 or 150 degree Celsius exceeds by at least 10%, e.g. by at least 50%, an effective dopant concentration at room temperature, i.e. 25 degree Celsius. According to an embodiment, the effective dopant concentration in the first portions 132a of the auxiliary structure at a temperature beyond the reference temperature is at least twice as high as the effective dopant concentration at room temperature.

The collector structure 138 directly adjoins the first portions 132a of the auxiliary structure. Either the collector structure 138 or the auxiliary structure or both are patterned along at least one horizontal direction such that a minority charge carrier injection efficiency of the rear side structure 130 varies along at least one horizontal direction parallel to the first surface 101 at least in the transistor cell area 610 either at a first temperature typical for a first operation mode, e.g., a normal operation mode around the room temperature, or at an elevated second temperature, which may be characteristic for another operation mode, e.g., under a short-circuit condition. The collector structure 138 further directly adjoins a second load electrode 320 at the rear side of the semiconductor device 500.

In the diagram at the bottom of FIG. 1A the continuous line 401 shows a minority charge carrier injection efficiency distribution along a horizontal cross-sectional line at room temperature according to an embodiment. The minority charge carrier injection efficiency varies between $\eta_1$ and $\eta_2$. The dotted line 402 shows the minority charge carrier injection efficiency distribution along the same cross-sectional line at an elevated temperature at which a higher portion of the deep level donors is electrically active. The higher temperature generally increases the minority charge carrier injection efficiency. However, the activation of the deep level donors counteracts to some degree the thermally induced increase of the minority charge carrier injection efficiency such that the amplitude of the variation decreases with increasing temperature. The deep level donors allow to make use of a nearly uniform minority charge carrier injection efficiency distribution or a minority charge carrier injection efficiency distribution with weakly pronounced peak values in a first temperature range associated to a first operational state of the semiconductor device 500 on the one hand and a minority charge carrier injection efficiency distribution with more pronounced peak values in a second temperature range associated to a second operational state of the semiconductor device 500 on the other hand.

Junctions j0 between the collector structure 138 and the first portions 132a of the auxiliary structure may be unipolar homojunctions or pn junctions, wherein the homojunction type at room temperature may differ from the homojunction type at a temperature above a threshold temperature. The junctions j0 may extend parallel to the first surface 101 as shown in illustration I, or may be tilted to the first surface 101, e.g., orthogonal to the first surface 101 as shown in illustration II.

The first portions 132a of the auxiliary structure may exclusively contain deep level dopants NDD or both deep level dopants NDD and shallow level dopants of the same or another dopant type. According to an embodiment, the deep level dopants NDD are donors with at least one energy level at least 150 meV below a conduction band of the semiconductor material of the semiconductor body 100. According another embodiment the deep level dopants are deep acceptors such as indium atoms.

According to an embodiment, the semiconductor material of the semiconductor body 100 is silicon. The deep level dopants NDD may be, for example chalcogen atoms like selenium (Se) atoms, sulfur (S) atoms or both. According to an embodiment, the deep level dopants are selenium (Se) atoms with four dopant levels having a distance of more than 200 meV to the conduction band of silicon. Further, a time constant for ionizing specific selenium dopant levels is in the range of several microseconds and corresponds to the range of the specifications for the duration of short circuit phases the semiconductor device 500 is expected to sustain. A complete ionization of these dopant levels can be achieved within a time interval of, typically, 10 μs such that activation of the selenium increases significantly during the short circuit pulse, in particular at the end of the pulse.

The degree of ionization of the deep level dopants NDD in the semiconductor body 100 continuously increases with temperature and shows a kind of saturation for very high temperatures, e.g. in a range between 100° C and 200° C. As a consequence, at low temperatures the transistor gain of an intrinsic bipolar transistor Tr1 formed by the collector structure 138, the drift zone structure 120 and the body zones 115 is comparatively high and avoids a field inversion effect in the short-circuit phase. At elevated temperatures as typical for short-circuit events, the electrically activated dopants decrease the transistor $\alpha_{pnp}$ and, as a consequence, decrease a leakage current occurring after the short-circuit phase. As a result, short-circuit ruggedness is improved.

The following description refers to n-channel IGBTs with an n doped drift zone 121 and a p doped collector structure 138. The intrinsic bipolar junction transistor Tr1 formed by the p doped collector structure 138, the n doped drift zone structure 120, and the p doped body regions 115 is a pnp transistor with a transistor gain $\alpha_{pnp}$. The following considerations accordingly apply to p-channel IGBTs with p doped drift zone 121 and n doped collector structure 138 as well as to MGDs.

The diagram of FIG. 1B refers to an embodiment using deep level donors to improve overall short circuit ruggedness.

Typical applications of IGETs, e.g. in half bridge configurations, require that the IGBT withstands a short circuit phase that lasts for at least a specified short circuit period of typically 5-10 µs at a specified short circuit current. At operation conditions within the specified maximum ratings, the IGBT is expected to reliably recover from the short circuit state.

One of several known possible destruction mechanism identified for IGBTs in case of a short circuit condition is the short circuit current destruction occurring during the short-circuit phase. Short circuit current destruction may be triggered by local field inversion in the semiconductor body 100 caused by an uncompensated electron current into the direction of the collector structure 138. A high transistor gain $\alpha_{pnp}$ of the intrinsic transistor Tr1 and a resulting sufficiently high hole current from the collector structure 138 into the drift zone structure 120 may compensate for the electron flow to a sufficient degree such that no or only weak field inversion takes place. Hence, high ruggedness against short circuit current, destruction may be achieved by ensuring a sufficiently high transistor gain $\alpha_{pnp}$ and high minority charge carrier injection efficiency $\eta_{inj}$.

Another destruction mechanism is thermal destruction taking place in a blocking mode after the short-circuit phase. During the short-circuit phase the high current through the IGBT significantly increases the temperature and, as a consequence, the charge carrier generation rate in the semiconductor body 100. When the IGBT recovers from the short-circuit mode and switches to a blocking state, the generated electrons in the heated semiconductor body 100 are effective as base current for the intrinsic bipolar junction transistor Tr1. A high charge carrier generation rate in combination with a high transistor gain $\alpha_{pnp}$ may result in that the intrinsic transistor Tr1 causes a leakage current that further heats up the semiconductor body 100 thereby further increasing the charge carrier generation rate. The steadily increasing leakage current results in the destruction of the IGBT some microseconds or even several tens or hundreds microseconds after the IGBT has recovered from the short-circuit state. High ruggedness against thermal destruction may be achieved with low transistor gain $\alpha_{pnp}$ and low minority charge carrier injection efficiency $\eta_{inj}$.

The deep level donors allow for increasing the minority charge carrier injection efficiency $\eta_{inj}$ at room temperature without increasing, at the same scale, the minority charge carrier injection efficiency $\eta_{inj}$ at elevated temperatures typically occurring in the semiconductor body 100 at the end of and after the short circuit state.

FIG. 1B shows marks 408 referring to a first reference IGBT with a non-patterned boron doped collector layer 138 with an implant dose D1. Marks 409 refer to a second reference IGBT with a collector layer 138 containing a non-patterned boron doped implant at an implant dose D3 as well as an additional non-patterned selenium implant at an implant dose D2 after a laser anneal at the rear side, wherein D1<D2<D3. For the first reference IGBT, the thermal short-circuit destruction occurs after 9 µs and short circuit current destruction is triggered at 180 A. For the second reference IGBT the thermal short-circuit destruction occurs after 9 µs and short circuit current destruction takes place at 270 A.

The higher boron implant in the second reference IGBT improves ruggedness against short circuit current destruction without deteriorating ruggedness against thermal destruction, since for elevated temperatures the deep level dopants become electrically active and compensate for the effect of the increased boron content on the minority charge carrier injection efficiency $\eta_{inj}$. In addition, in the IGBT mode, the higher minority charge carrier injection efficiency $\eta_{inj}$ may result in a denser charge carrier plasma in the drift zone structure 120 thereby reducing the collector-to-emitter saturation voltage VCE_sat. The implanted deep level donors may further improve overcurrent shutdown ruggedness.

The following embodiments extend the concept of deep level dopants on LEBE (locally enhanced backside emitter) approaches with horizontally varying minority charge carrier injection efficiency $\eta_{inj}$ for increased switching softness.

The rear side structure 130 of the semiconductor device 500 illustrated in FIGS. 2A and 2B include a collector structure 138 formed as a layer with one single or a plurality of spatially separated enhanced emitter zones 138a. The collector structure 138 further includes one single non-enhanced emitter zones 138b non-enhanced emitter zone 138b or a plurality of non-enhanced emitter zones 138b between the enhanced emitter zones 138a. A mean net dopant dose in the enhanced emitter zones 138a is at least 50% higher than a mean net dopant dose in the non-enhanced emitter zones 138b. According to other embodiments the mean net dopant dose in the enhanced emitter zones 138a is at least 2 times higher than the mean net dopant dose in the non-enhanced emitter zones 138b. According to further embodiments the mean net dopant dose in the enhanced emitter zones 138a is at least 5, 10, 20, 50, 100, 200, 500 or 1000 times higher than the mean net dopant dose in the non-enhanced emitter zones 138b. According to an embodiment, the mean net dopant dose in the enhanced emitter zones 138a is in a range from 5E12 $cm^{-2}$ to 1E15 $cm^{-2}$, for example in a range from 1E13 $cm^{-2}$ to 1E14 $cm^{-2}$. The mean net dopant dose in the non-enhanced emitter zones 138b is in a range from 1E12 $cm^{-2}$ to 1E14 $cm^{-2}$, for example in a range from 2E12 $cm^{-2}$ to 2E13 $cm^{-2}$. The total dose in each emitter zone 138a, 138b may be implanted by a single implantation or by a combination of several implantations. According to an embodiment, one or both types of the emitter zones 138a, 138b may be formed by a first implantation followed by an annealing step, which may include a high temperature anneal or a laser anneal, and a second implantation followed by no annealing step or only by a low temperature annealing, e.g. at a temperature below 400° C.

The collector structure 138 implements a LEBE structure. The horizontal cross-sectional areas of the enhanced emitter zones 138a may be dots, stripes or may form a grid embedding, in the horizontal plane, the non-enhanced emitter zones 138b. A population density of the enhanced emitter zones 138a may be regular at least in the transistor cell area 610 or may get sparser or denser with increasing distance to an edge of the transistor cell area 610 to obtain a smaller current density in the edge area 690 during turn-off, so that the risk of a local dynamic avalanche can be reduced or avoided. In another embodiment, the density of the enhanced emitter zones 138a can also vary in the transistor cell area 610, wherein the enhanced emitter zones 138a form a kind a superlattice.

The rear side structure 130 further includes an auxiliary structure 132 including first portions 132a. The first portions 132a are arranged in the vertical projection of the enhanced emitter zones 138a and form second pn junction pn2 with the enhanced emitter zones 138a. Portions of the drift zone structure 120 may separate the first portions 132a along the horizontal directions.

The first portions 132a include deep level dopants NDD at an energy level at least 150 meV, e.g. 200 meV, below a conduction band edge of the silicon of the semiconductor body 100, for example selenium atoms or sulfur atoms.

An implant dose of the deep level dopants may be in a range from $5E12$ cm$^{-2}$ to $5E14$ cm$^{-2}$, for example in a range from $1E13$ cm$^{-2}$ to $5E13$ cm$^{-2}$. The first portions 132a may further include shallow level dopants such as phosphorus or arsenic atoms or radiation-induced donors.

The diagram at the bottom of FIG. 2A shows the distribution 421 of the hole injection efficiency $\eta_{inj}$ (T1) the rear side structure 130 with regard to the drift zone structure 120 at a first temperature T1 at which only a small part of the deep level dopants is electrically active. The mostly inactive deep level dopants NDD do not significantly influence the injection efficiency $\eta_{inj}$ (T1). The lateral variation of the hole injection efficiency $\eta_{inj}$ is mainly controlled by the difference between the dopant concentrations in the enhanced and non-enhanced emitter zones 138a, 138b. The distribution of the hole injection efficiency $\eta_{inj(T1)}$ at temperature T1 may include pronounced peaks in the enhanced emitter zones 138a.

The first portions 132a are only to a low degree electrically active and do hardly effect the hole emitter efficiency at the beginning of a short-circuit phase. The LEBE collector structure provides sufficient holes to carry the short-circuit current. After an activation time of several microseconds, the deep level dopants in the first portions 132a become fully electrically active and reduce the hole emitter efficiency at the end of and after the short-circuit phase.

As illustrated in FIG. 2B, at a second temperature T2 at which the ionization degree of the deep levels is high, the first portions 132a have a higher effective n+ doping than in FIG. 2A and locally reduce the hole injection from the enhanced emitter zones 138a as shown by the distribution 422 of the hole injection efficiency $\eta_{inj}$ (T2) at the second temperature T2. The reduction of the hole injection from the rear side decreases the transistor gain $\alpha_{pnp}$ of the intrinsic phase transistor Tr1 and, as a consequence, the leakage current during and after the short-circuit. In this way, the deep level dopants NDD improve the overall short-circuit ruggedness without deteriorating other parameters of the semiconductor device 500 such as soft switching behavior at low temperatures at which the softness is usually more critical than at higher temperatures.

Alternatively or in addition, the dopant concentration in the enhanced and/or the not enhanced emitter zones 138a, 138b may be increased for improving, without losing short circuit ruggedness, softness of the switching behavior and/or for decreasing the static losses.

The rear side structure 130 as illustrated in FIGS. 2A and 2B may be formed by using the same implant mask at the rear side for providing the dopant differences between both the enhanced and non-enhanced emitter zones 138a, 138b as well as between the first portions 132a of the auxiliary structure 132 and the drift zone structure 120. A laser anneal may activate the implanted dopants.

Figure 3A:
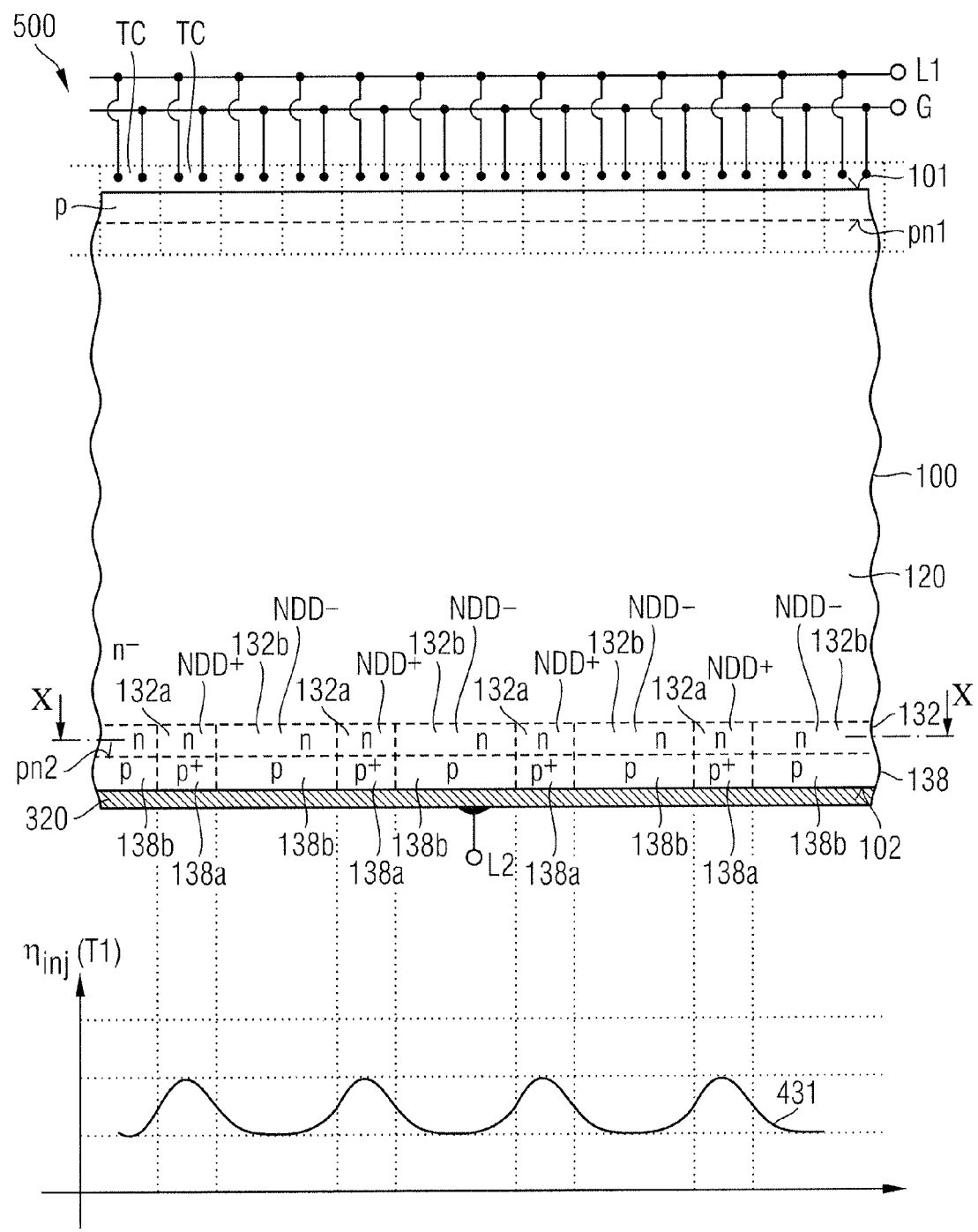
FIG. 3A is a schematic vertical cross-sectional view of a portion of a semiconductor device according to a further embodiment including horizontally patterned auxiliary and collector structures at a first temperature T1.
Figure 3B:
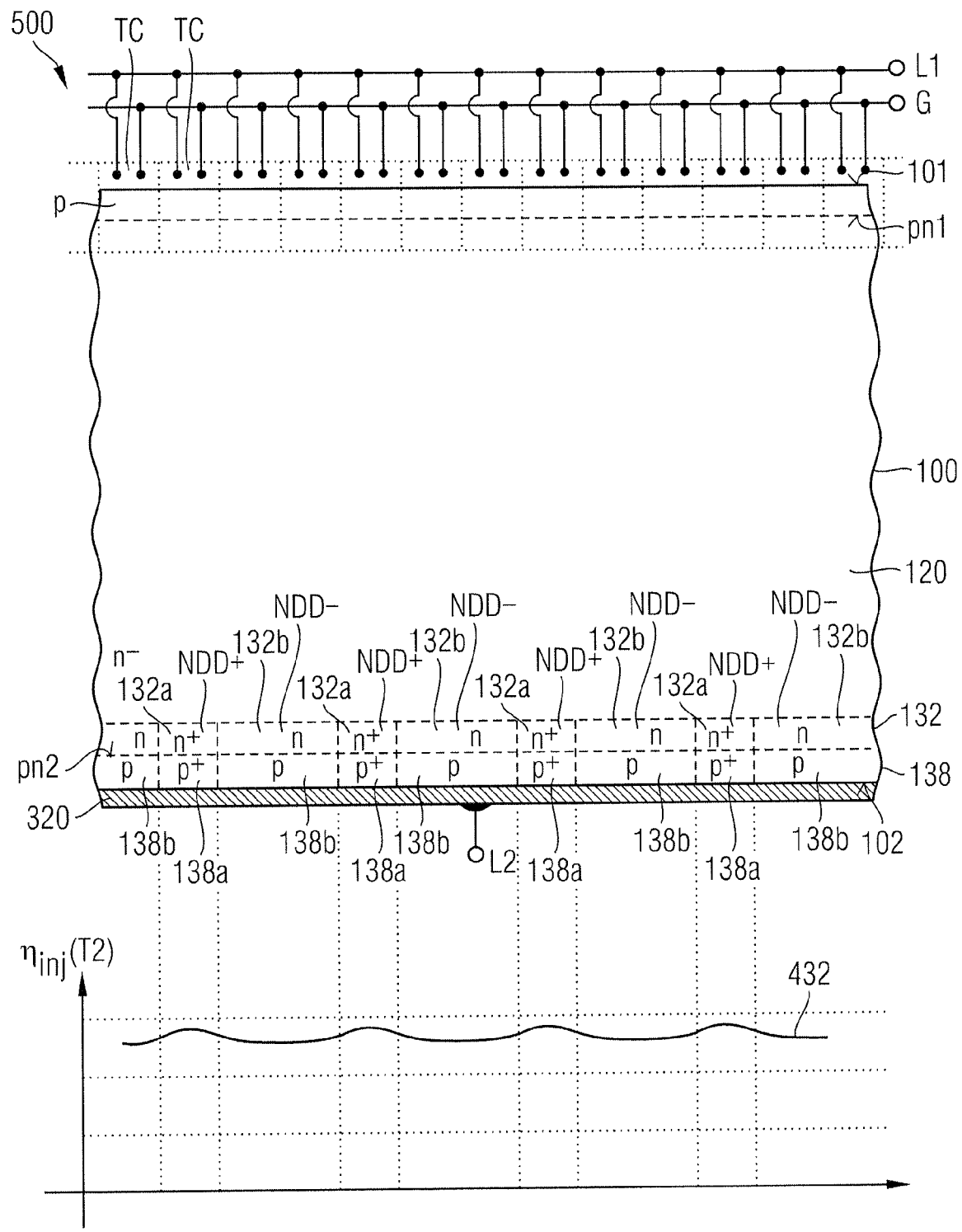
FIG. 3B illustrates the semiconductor device portion of FIG. 3A at a second temperature T2 higher than T1.

The auxiliary structure 132 of the semiconductor device 500 illustrated in FIGS. 3A and 3B includes second portions 132b separating the first portions 132a of the auxiliary structure 132. The second portions 132b may mainly contain shallow level dopants. For example, the first and second portions 132a, 132b contain the same concentration and/or dose of shallow level dopants, wherein the shallow level dopants may be introduced from the rear side by an unmasked implant or diffusion process. The second portions 132b may be mainly devoid of deep level dopants. The shallow level dopants may be dopant atoms and/or radiation-induced donors, e.g. hydrogen-related donors. A ratio of shallow level dopants to deep level dopants may be between 1:100 and 100:1.

A dopant dose of the shallow level dopants is higher than a breakdown charge of the semiconductor material of the semiconductor body 100.

At the first temperature T1, the auxiliary structure 132 may be effective as a field stop zone or a portion of a field stop zone in a blocking state of the IGBT mode of the semiconductor device 500. The maximum dopant concentration of shallow level dopants in the auxiliary structure 132 may be at least twice as high as in the drift zone structure 120.

According to the illustrated embodiment, the second portions 132b contain deep level dopants NDD- at a lower concentration/dose than the first portions 132a. For example, the deep level dopant dose in the first portions 132a is at least 1.5, 2, 5 or at least 10 times as high as the deep level dopant dose in the second portions 132b.

At the temperature T1 the distribution 431 of the hole injection efficiency $\eta_{inj}$ (T1) may vary between a maximum and a minimum value. At the temperature T2 the activated deep level dopants reduce the hole injection efficiency $\eta_{inj}$ (T2) of both the first and second portions 138a, 138b as shown by distribution 432.

The second portions 132b containing deep level dopants NDD allow for increasing the dopant concentration in the non-enhanced emitter zones 138b compared to the case in which the second portions 132b contain only shallow level dopants. A higher dopant concentration in the non-enhanced emitter zones 138b increases short circuit current destruction ruggedness.

Formation of the auxiliary structure 132 may include an unmasked implant of deep level dopants and a masked implant of deep level dopants using the implantation mask for patterning the collector structure 138. For further details, reference is made to the description of the previous figures.

Figure 4A:
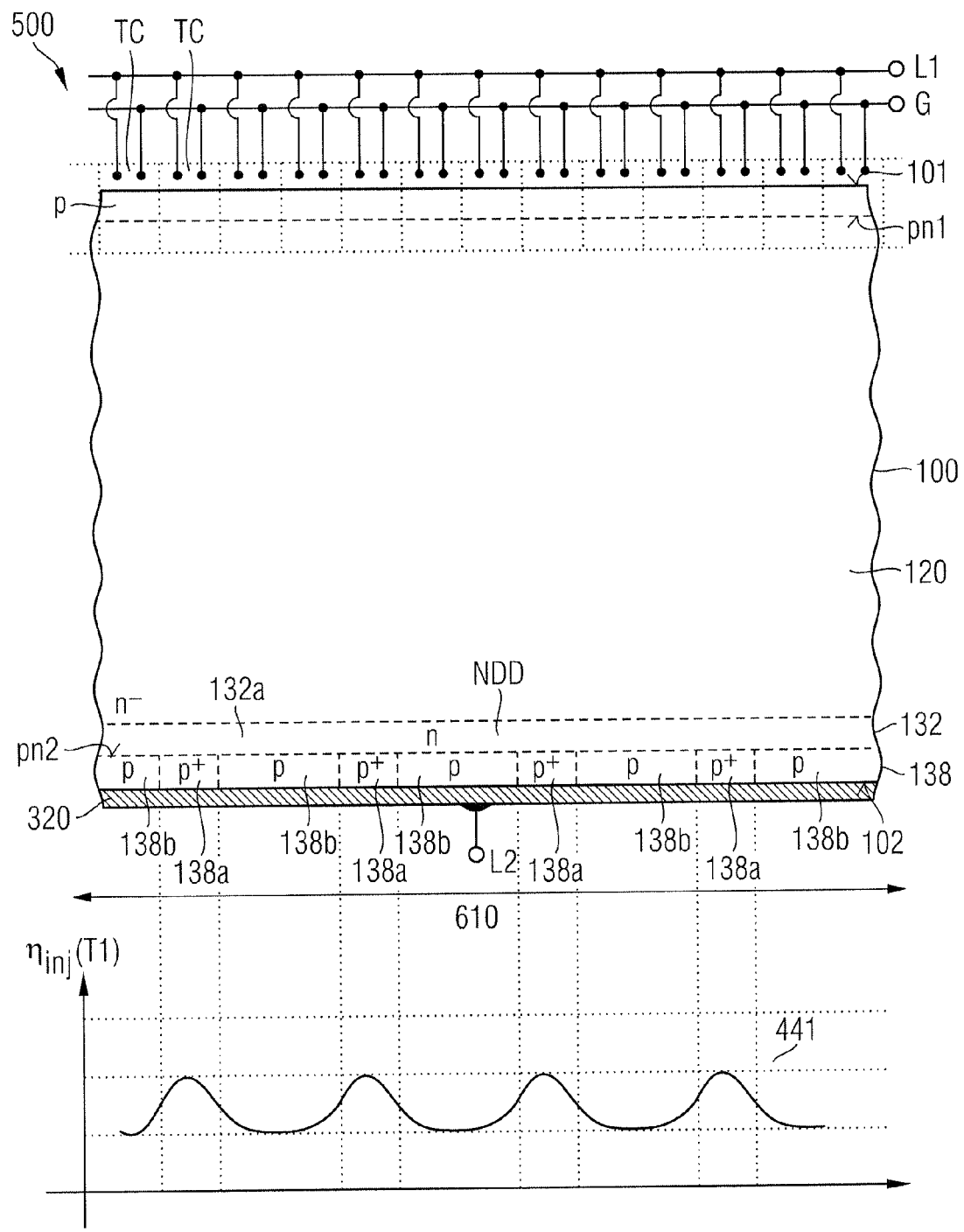
FIG. 4A is a schematic vertical cross-sectional view of a portion of a semiconductor device in accordance with an embodiment concerning a non-patterned auxiliary layer and a horizontally patterned collector structure at a first temperature T1.
Figure 4B:
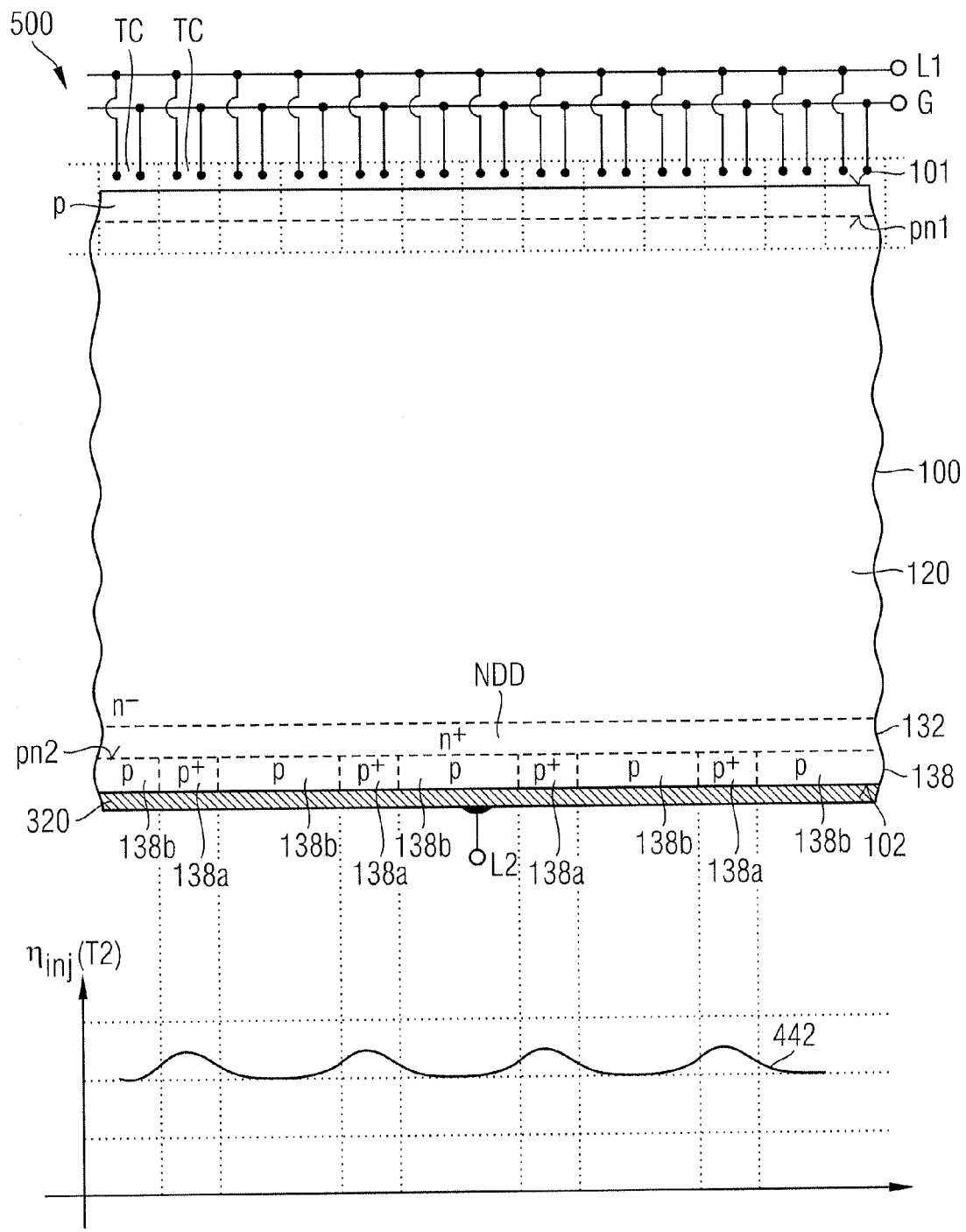
FIG. 4B illustrates the semiconductor device portion of FIG. 4A at a second temperature T2 higher than T1.

In FIGS. 4A and 4B the first portions 132a of the auxiliary structure 132 form a contiguous layer at least in the transistor cell area 610. At a relatively low first temperature T1, the distribution 441 of the hole injection efficiency $\eta_{inj}$ (T1) may include pronounced peaks in the enhanced emitter zones 138a. At a second, higher temperature T2, the hole emitter efficiency $\eta_{inj}$ (T2) of both the enhanced and the non-enhanced emitter zones 138a, 138b is equally reduced as shown by distribution 442 in FIG. 4B. The partial transistor gain increase with temperature for deep donors in the auxiliary structure 132 is lower compared to the case with only shallow donors in the auxiliary structure 132.

Compared to the previous embodiments, the manufacture process is simplified, whereas a difference between a minimum-to-maximum distance of the hole injection efficiency $\eta_{inj}$ (T1) at the first temperature T1 and a minimum-to-maximum distance of the hole injection efficiency $\eta_{inj}$ (T2) at the second temperature T2 is comparatively low as it becomes apparent by a comparison of distributions 441 and 442.

According to FIGS. 5A to 5B, a LEBE approach may also be realized by a contiguous, uniformly doped collector structure 138 forming a continuous layer and an auxiliary structure 132 comprising first and second portions 132a, 132b as yet described with reference to FIGS. 2A to 4B.

Figure 5B:
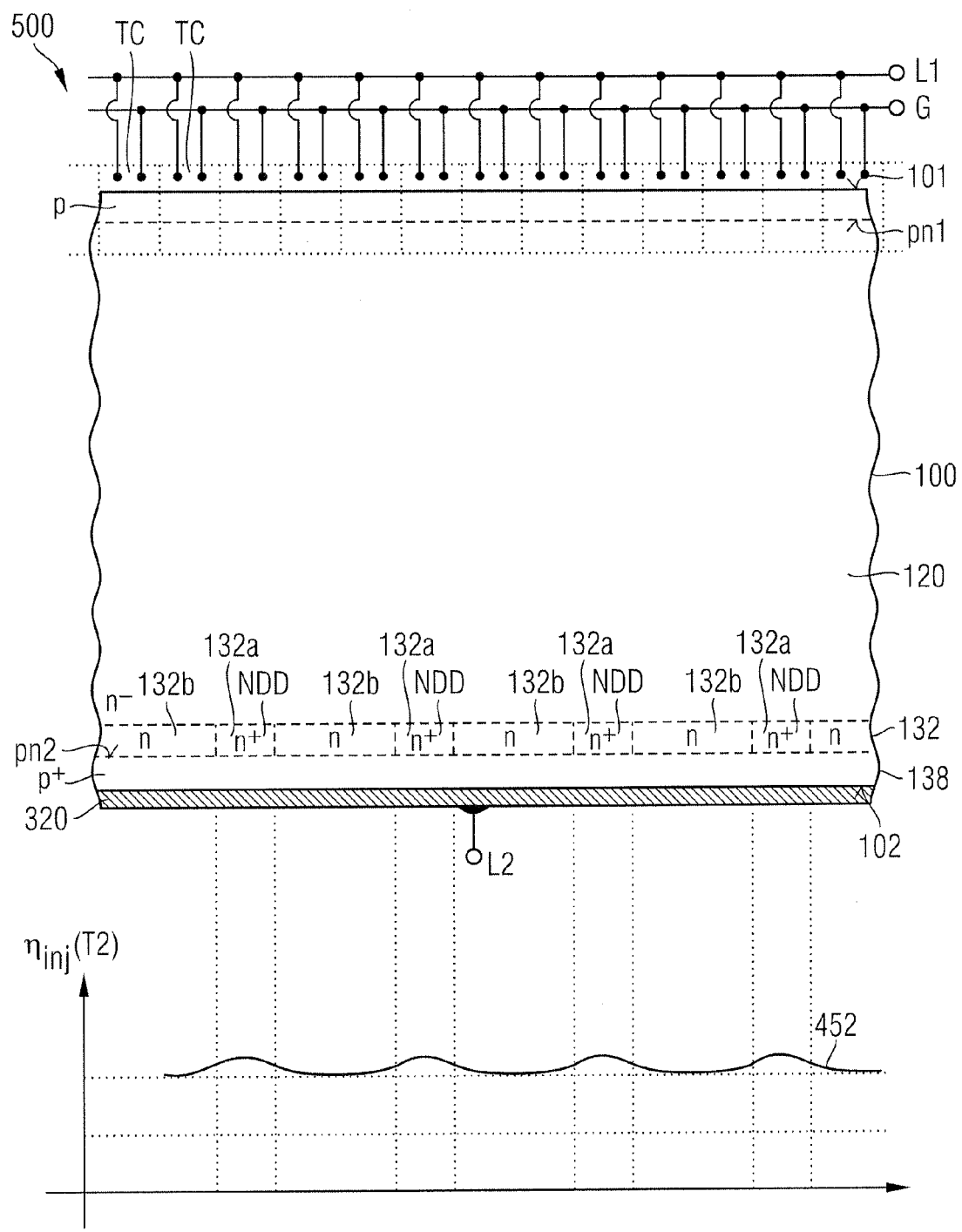
FIG. 5B illustrates the semiconductor device portion of FIG. 5A at a second temperature T2 higher than T1.

According to FIG. 5A at the lower first temperature T1 the hole injection efficiency $\eta_{inj}$ (T1) of the rear side structure 130 is modulated. Since the deep level donors NDD in the first portions 132a may be active to a low degree, the electrically active dopant concentration in the first portions 132a may be to some degree lower than in the second portions 132b such that the hole injection efficiency $\eta_{inj}$ (T1) is locally increased in the first portions 132a as shown by distribution 451. At a higher second temperature T2, the deep level dopants NDD become electrically active and increase the effective dopant concentration in the first portions 132a resulting in a reduction of the increase of the hole injection efficiency with temperature in the first portions 132a as illustrated by distribution 452 in FIG. 5B. Consequently, the partial transistor gain increase with temperature for deep donors in the auxiliary structure 132 is lower compared to the case with only shallow donors in the auxiliary structure 132.

The deep level dopants NDD may be contained exclusively in the first portions 132a or in both the first and second portions 132a, 132b, wherein the deep level dopant dose in the first portions 132a is at least 50%, for example more than 100% higher than in the second portions 132b.

Figure 6A:
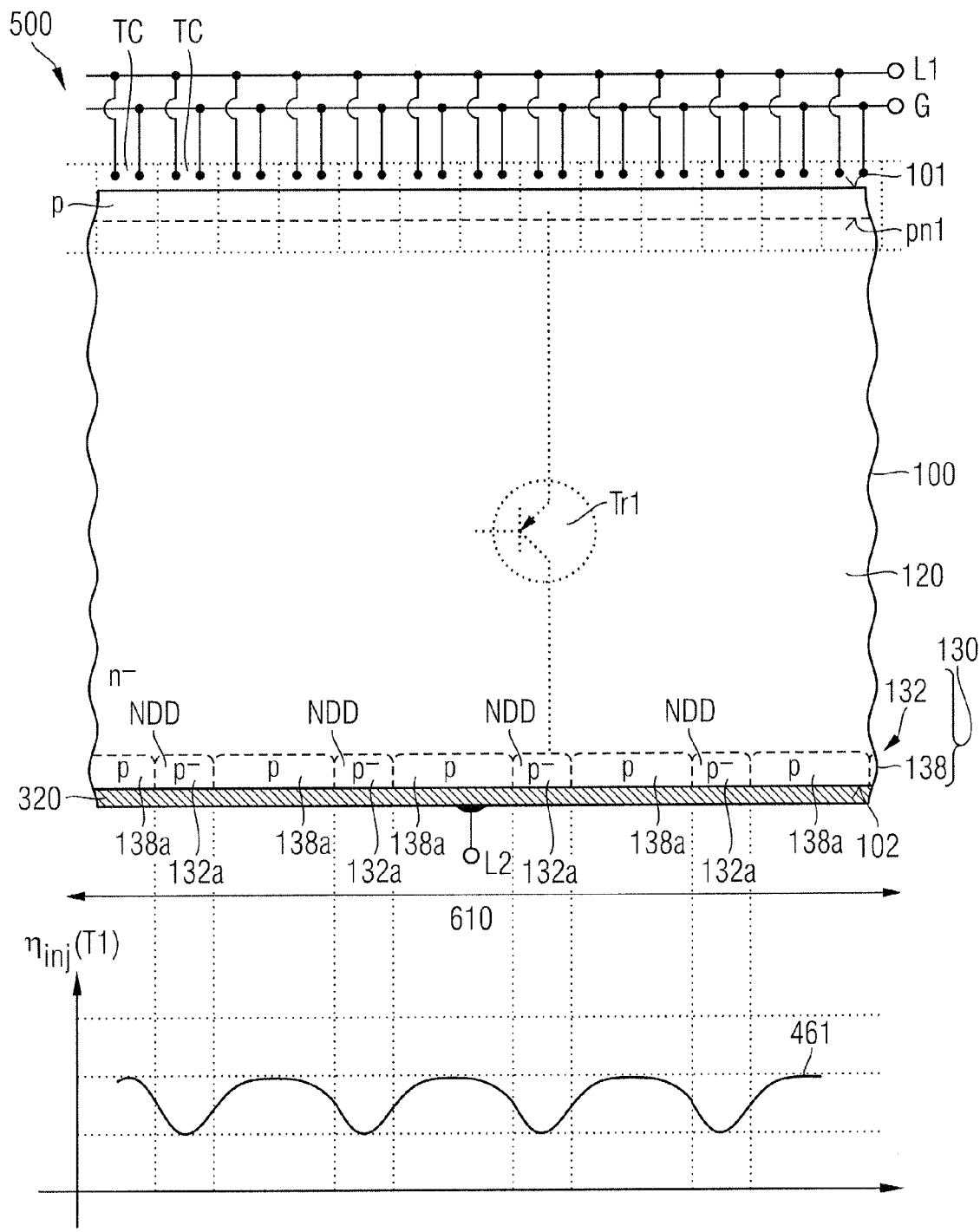
FIG. 6A is a schematic vertical cross-sectional view of a portion of semiconductor device according to an embodiment concerning temporary microchannels at the rear side at a first temperature T1.
Figure 6B:
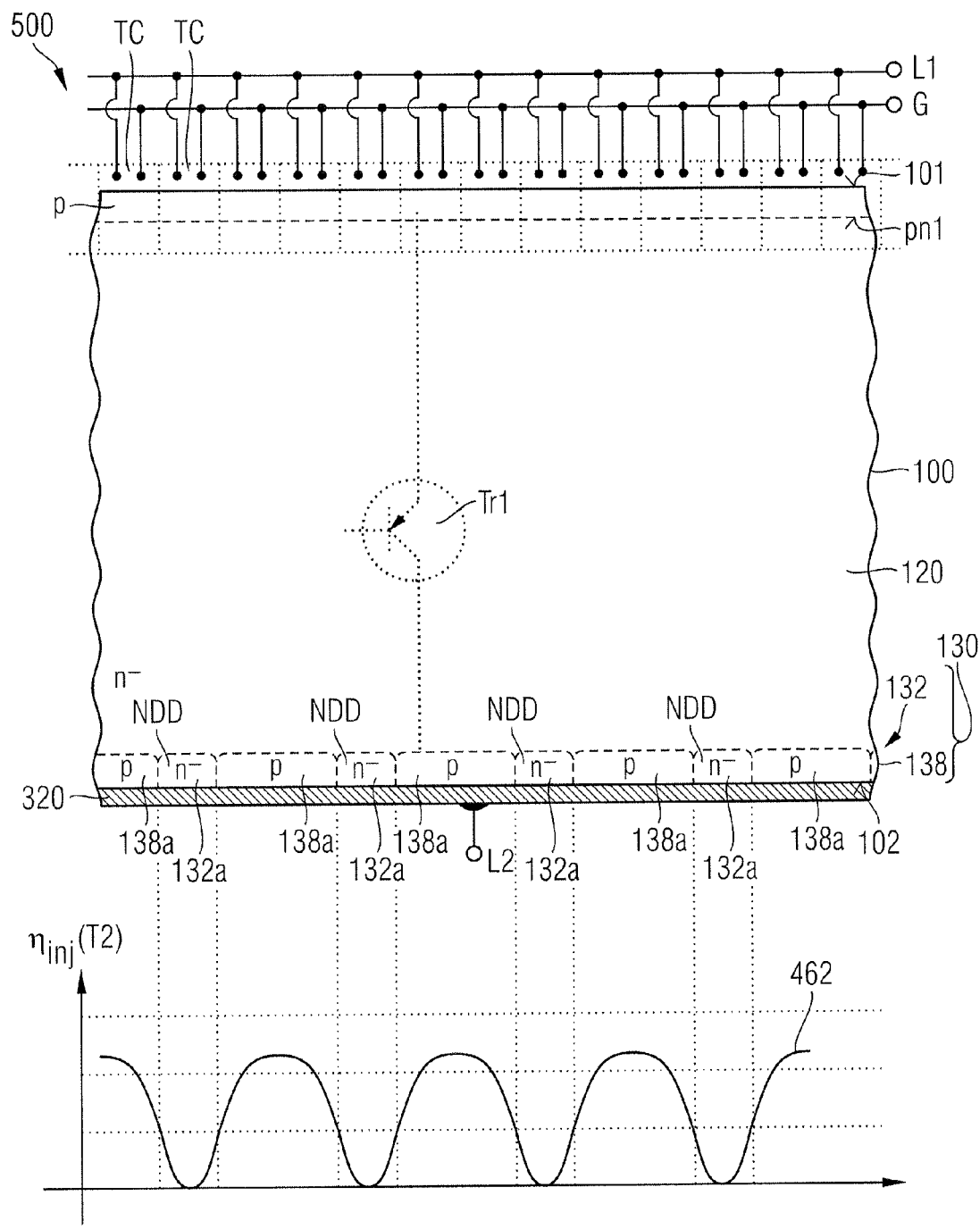
FIG. 6B illustrates the semiconductor device portion of FIG. 6A at a second temperature T2 higher than T1.

FIGS. 6A to 6B refer to an embodiment with the collector and auxiliary structures 138, 132 formed in the same layer. The collector structure 138 includes spatially separated enhanced emitter zones 138a. First portions 132a of the auxiliary structure 132 are formed between the enhanced emitter zones 138a. The first portions 132a of the auxiliary structure 132 contain deep level dopants NDD and may contain acceptor atoms at the same concentration as the enhanced emitter zones 138a. A population density of the first portions 132a of the auxiliary structure 132 may be uniform or may decrease or increase with increasing distance to an edge of the transistor cell area 610. At a first temperature T1 the hole injection efficiency $\eta_{inj}$ (T1) of the rear side structure 130 may be slightly reduced in the areas assigned to the first portions 132a of the auxiliary structure 132 as shown by distribution 461.

During a short-circuit phase the ohmic conduction losses may heat up the semiconductor body 100 to, for example, beyond 200° C. Since the charge carrier generation rate strongly depends on the temperature, electrons are generated in the semiconductor body 100 at a high rate.

When the IGBT recovers from the short-circuit phase by switching to a blocking state of the IGBT mode, the generated electrons in the heated semiconductor body 100 are effective as base current for the intrinsic transistor Tr1. The high charge carrier generation rate in combination with a high transistor gain $\alpha_{pnp}$ may result in that the intrinsic transistor Tr1 causes a leakage current that may further heat up the semiconductor body 100 thereby further increasing the charge carrier generation rate. A steadily increasing leakage current may result in the destruction of the semiconductor device 500 even some milliseconds after the semiconductor device 500 has recovered from the short-circuit phase.

Instead, when the semiconductor device 500 is heated up to the second temperature T2, the deep level dopants NDD become electrically active and may overcompensate a p-type background doping in the first portions 132a such that the first portions 132a become effective as n-type microchannels between the drift zone structure 120 and the second surface 102 as illustrated in FIG. 6B. For the n-type microchannels the hole injection efficiency is reduced to zero as illustrated by distribution 462.

The n-type microchannels drain off the electrons from the semiconductor body 100 in a way that a voltage drop induced at the second pn junctions pn2 increases only moderately. In other words, the microchannels reduce the increase of the gain of the intrinsic bipolar junction transistor Tr1 such that at the same charge carrier generation rate the leakage current is significantly reduced. Since the leakage current is reduced, the leakage current can trigger a thermal runaway only at a higher temperature. Hence the critical temperature is shifted to a higher value. Since the device is allowed to reach a higher temperature, the device can absorb more thermal energy during the short-circuit condition than without the first portions 132a of the auxiliary structure 132. As a consequence, the device can be specified for a longer short-circuit period at the same maximum short-circuit current or for a higher short-circuit current for the same short-circuit period.

In FIG. 7 the drift zone structure 120 includes a weakly doped drift zone 121 and a dedicated field stop zone 128, wherein a mean net dopant concentration in the field stop zone 128 is at least twice, for example at least ten times, as high as in the drift zone 121. The drift zone structure 120 including the drift zone 121 and the field stop layer 128 may be combined with any of the previous embodiments. The field stop zone 128 allows for thinner semiconductor bodies 100 for the same forward blocking voltage capability and may include, for example, phosphorus atoms, arsenic atoms or radiation-induced dopants such as hydrogen-related donors. The dopant concentration in the field stop zone 128 corresponds at least to the breakdown charge.

Figure 8:
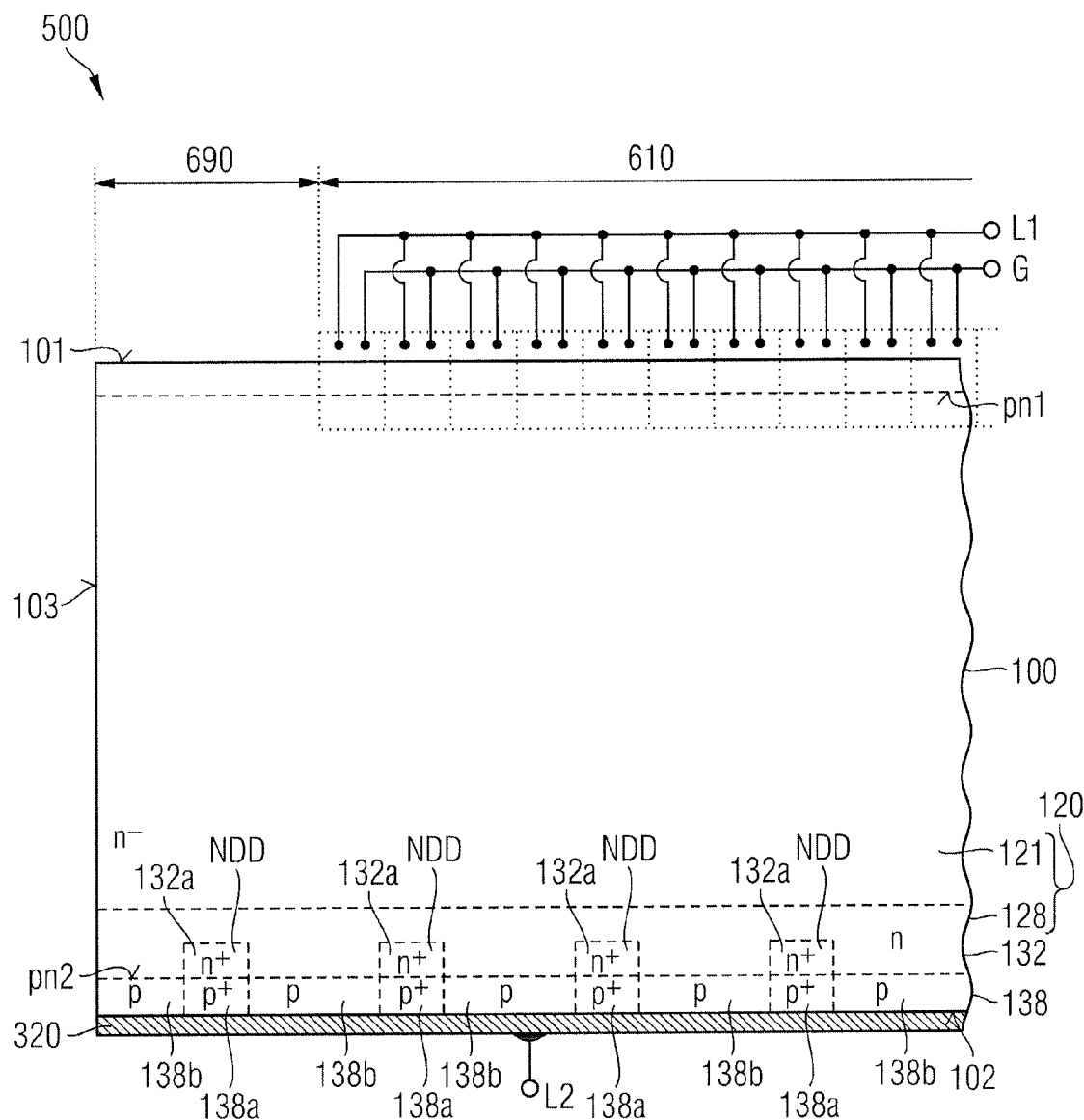
FIG. 8 is a schematic vertical cross-sectional view of a portion of a semiconductor device in accordance with an embodiment including an auxiliary structure extending into an edge area.

In FIG. 8, the auxiliary structure 132 includes first portions 132a containing deep level dopants NDD also in an edge area 690 between an outer surface 103 of the semiconductor body and the transistor cell area 610. The first portions 132a reduce the charge carrier plasma in the edge area 690 in the conductive IGBT mode according to an HDR (high dynamic robustness) approach.

Figure 9:
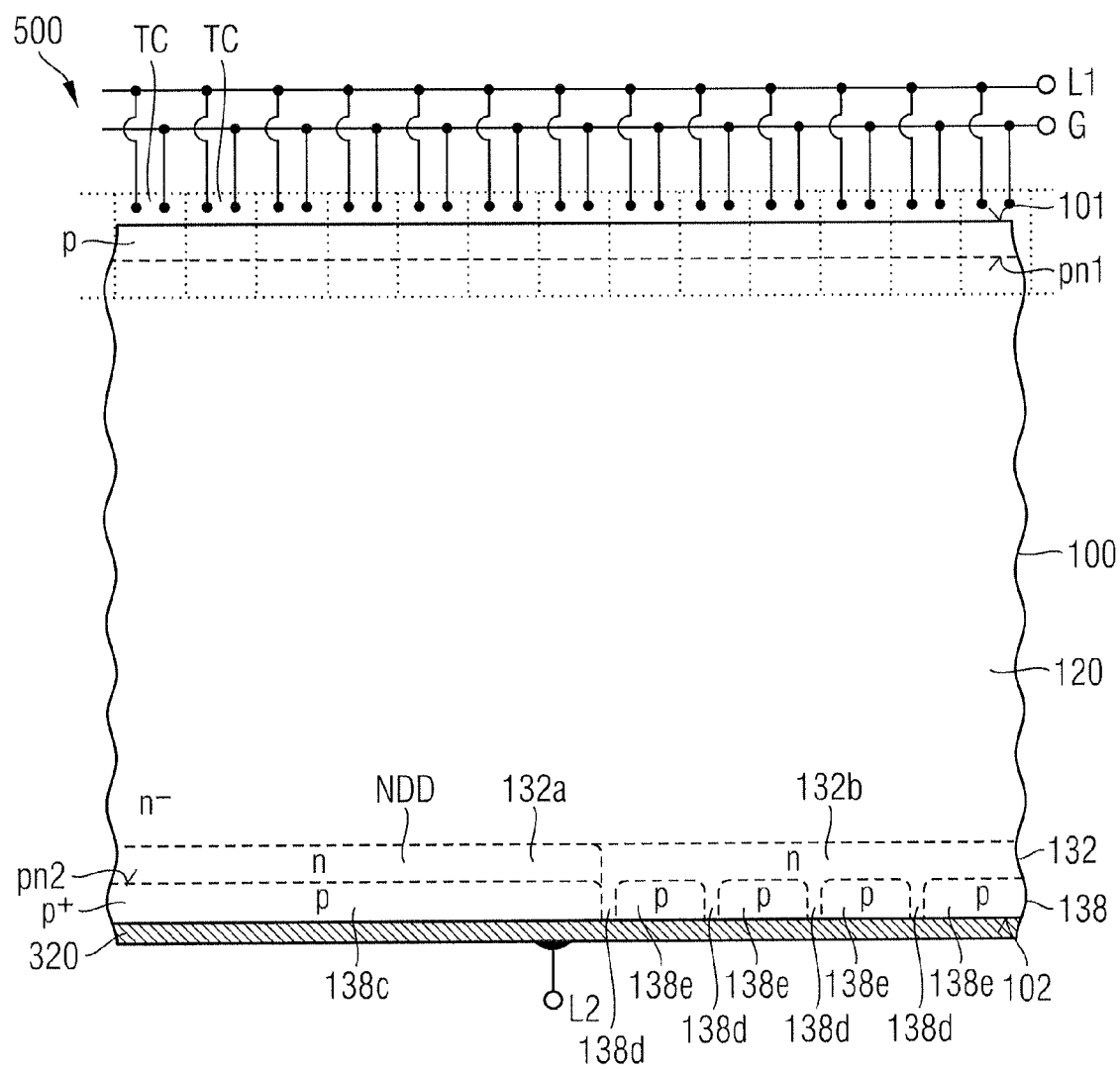
FIG. 9 is a schematic vertical cross-sectional view of a portion of a semiconductor device in accordance with an embodiment related to pilot zones of RC-IGBTs.

The semiconductor device 500 illustrated in FIG. 9 is or includes an RC-IGBT (reverse conducting IGBT). The collector structure 138 includes a wide p doped pilot zone 138c for igniting the IGBT forward mode, narrow p doped emitter zones 138e supporting the IGBT forward mode after ignition of the IGBT forward mode, and n doped channel zones 138d effective as cathode regions in the reverse conducting mode. The channel zones 138d extend between the second surface 102 and the drift zone structure 120 or between the second surface 102 and the auxiliary structure 132.

A first portion 132a of the auxiliary structure (132) containing deep level dopants NDD is arranged in the vertical projection of the pilot zone 138c. The pilot zone 138c and the first portion 132a of the auxiliary structure 132 form a pn junction. Ignition of hole injection from the pilot zone 138c into the drift zone structure 120 requires a sufficient lateral voltage drop along the pn junction. Typically, the lateral voltage drop increases with increasing temperature in the semiconductor body 100 due to reduced charge carrier mobility.

By contrast, in the semiconductor device 500 of FIG. 9 the deep level dopants NDD in the first portion 132a of the auxiliary structure 132 get activated with increasing temperature and counteract the effect of the reduced charge carrier mobility. A temperature dependency of the start of the forward conducting IGBT mode is reduced. In addition, thermal short circuit ruggedness is improved.

Figure 10A:
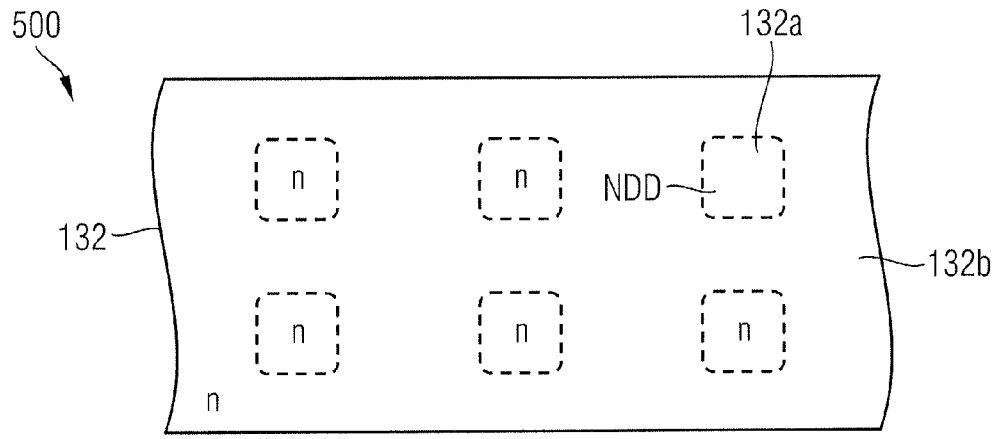
FIG. 10A is a schematic horizontal cross-sectional view of a portion of a semiconductor device for illustrating a layout with dot-shaped portions of an auxiliary structure.
Figure 10B:
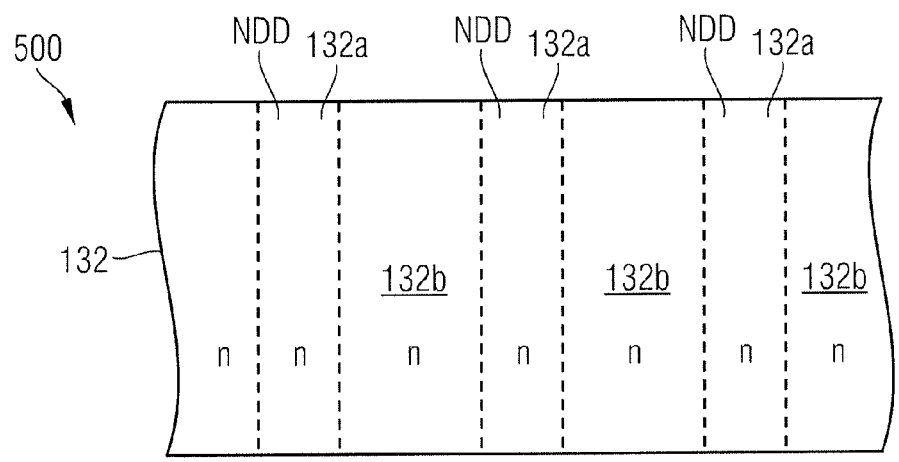
FIG. 10B is a schematic horizontal cross-sectional view of a portion of a semiconductor device for illustrating a layout with an auxiliary structure with stripe-shaped portions.
Figure 10C:
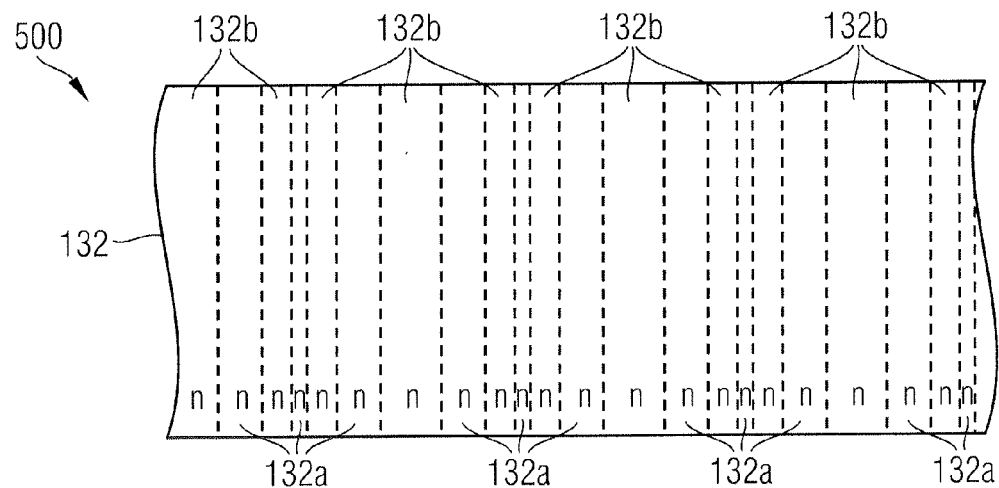
FIG. 10C is a schematic horizontal cross-sectional view of a portion of a semiconductor device for illustrating a layout with an auxiliary structure with stripe-shaped portions with varying widths for two types of stripe-shaped portions.

FIGS. 10A to 10C are horizontal cross-sectional views through the auxiliary structure 132 of FIG. 2A.

According to FIG. 10A the first portions 132a containing the deep level donors NDD may be dot-shaped, wherein a first horizontal dimension is at most three times as large as a second horizontal dimension orthogonal to the first horizontal dimension. For example, the lateral cross-sections are ovals, ellipses or stretched polygons with or without rounded or beveled corners. According to an embodiment, the first and second horizontal dimensions are approximately equal and the first portions 132a are circles or regular polygons such as hexagons or squares. A second portion 132b with no deep level dopants NDD or with a lower content of deep level dopants NDD separates the first portions 132b from each other.

FIG. 10B refers to a semiconductor device 500 with stripe-shaped first portions 132a containing deep level donors NDD. Stripe-shaped second portions 132b with no deep level dopants NDD or with a lower content of deep level dopants NDD separate the first portions 132a from each other, wherein all stripe-shaped first portions 132a have the same width and all stripe-shaped second portions 132b have the same width.

In FIG. 10C the widths of both the stripe-shaped first portions 132a and the stripe-shaped second portions 132b vary along an axis perpendicular to the longitudinal extension of the stripe-shaped first and second portions 132a, 132b. The width variations may be regular and periodic.

Figure 10D:
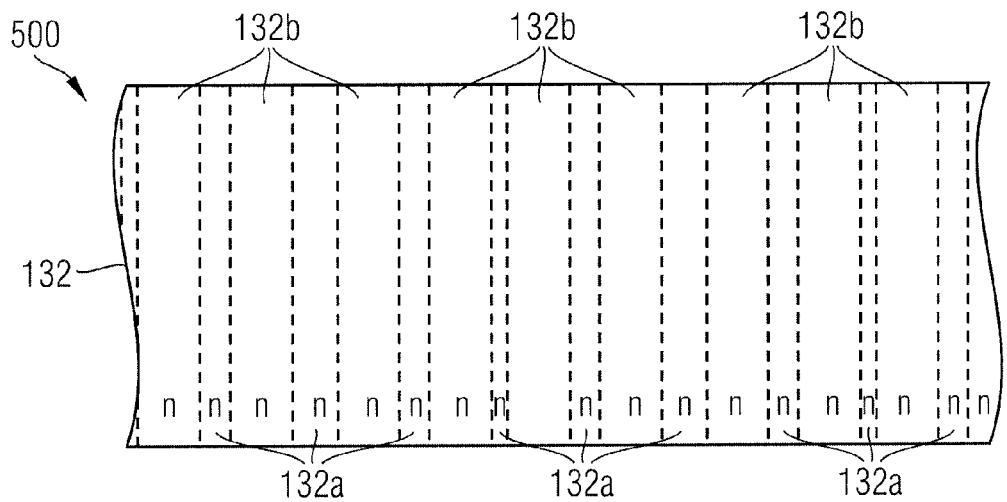
FIG. 10D is a schematic horizontal cross-sectional view of a portion of a semiconductor device for illustrating a layout with an auxiliary structure with stripe-shaped portions with varying widths for one type of stripe-shaped portions.

FIG. 10D refers to an embodiment with the width of either the stripe-shaped first portions 132a or the width of the stripe-shaped second portions 132b varying along the axis perpendicular to the longitudinal extension of the stripe-shaped first and second portions 132a, 132b. For example, the width of the stripe-shaped first portions 132a may vary and the width of the stripe-shaped second portions 132b may be the same for all stripe-shaped second portions 132b. The width variation of the stripe-shaped first portions 132a may be regular and periodic.

Figure 10E:
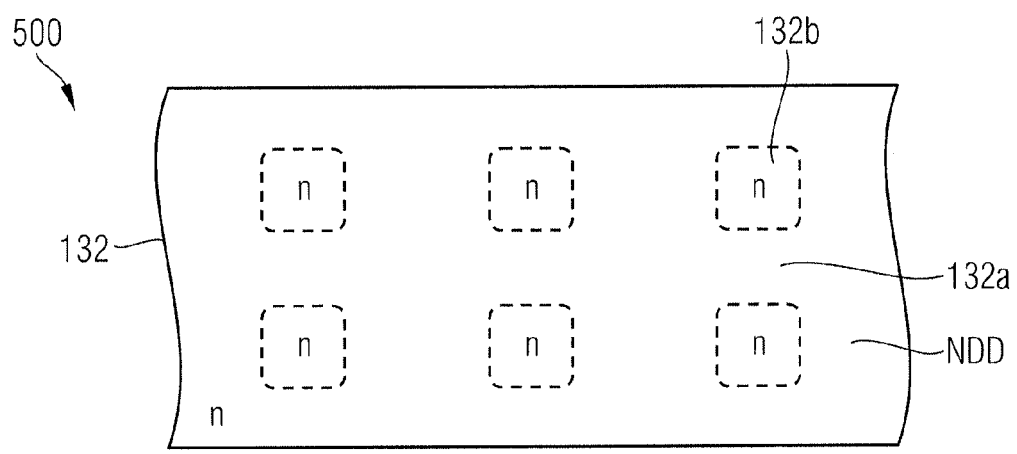
FIG. 10E is a schematic horizontal cross-sectional view of a portion of a semiconductor device for illustrating a layout with a grid-like auxiliary structure.

In FIG. 10E the first portions 132a containing deep level donors NDD directly adjoin to each other and form a grid with portions of the drift zone or second portions 132b of the auxiliary structure 132 formed in the meshes.

Figure 11:
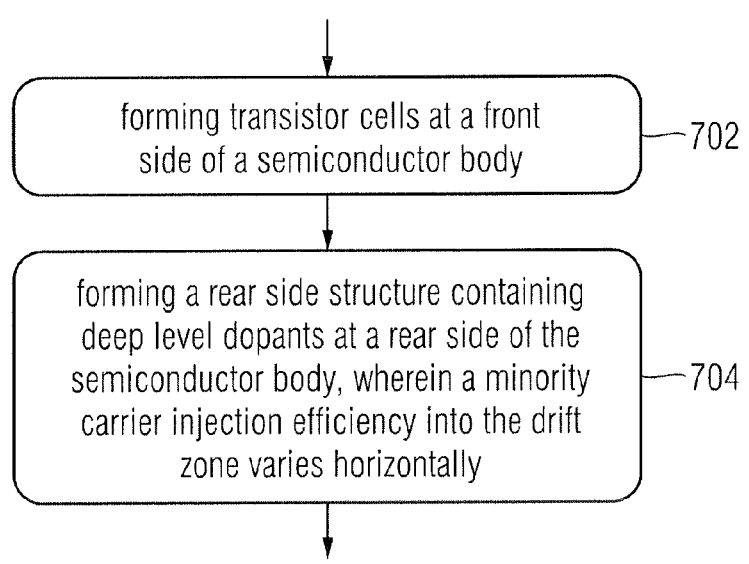
FIG. 11 is a simplified flow chart illustrating a method of manufacturing a semiconductor device according to a further embodiment.

FIG. 11 refers to a method of manufacturing a semiconductor device. Transistor cells are formed at a front side of a semiconductor body, wherein a drift zone formed in the semiconductor body is effective as drain of the transistor cells. At a rear side of the semiconductor body, a rear side structure is formed that includes deep level dopants requiring at least 150 meV. A minority carrier injection efficiency into the drift zone varies along a direction parallel to the second surface at least in a transistor cell area. A common mask may be used for horizontally patterning an auxiliary structure containing the deep level dopants and for horizontally patterning a collector structure effective as rear side emitter, wherein the auxiliary structure and the collector structure form the rear side structure.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
    transistor cells formed along a first surface at a front side of a semiconductor body in a transistor cell area;
    a drift zone structure forming first pn junctions with body zones of the transistor cells;
    an auxiliary structure between the drift zone structure and a second surface at a rear side of the semiconductor body, wherein at least a first portion of the auxiliary structure contains deep level dopants requiring at least 150 meV to ionize; and
    a collector structure directly adjoining the auxiliary structure, wherein at least one of the auxiliary structure and collector structure having a dopant concentration that varies such that an injection efficiency of minority carriers from the collector structure into the drift zone structure varies along a direction parallel to the first surface at least in the transistor cell area.

2. The semiconductor device of claim 1, wherein
    a difference between a minimum value and a maximum value of the injection efficiency in the transistor cell area increases or decreases with increasing temperature of the semiconductor body by at least 10%.

3. The semiconductor device of claim 1, wherein
    the injection efficiency varies by at least 10% along a direction parallel to the first surface at room temperature.

4. The semiconductor device of claim 1, wherein
    the collector structure is p-doped.

5. The semiconductor device of claim 1, wherein
    the deep level dopants comprise an energy level at least 150 meV below a conduction band edge of silicon.

6. The semiconductor device of claim 1, wherein
    the deep level dopants comprise at least one of selenium and sulphur atoms.

7. The semiconductor device of claim 1, wherein
    the collector structure is n-doped and the deep level dopants comprise indium atoms.

8. The semiconductor device of claim 1, wherein
    the first portion further contains shallow level dopants requiring less than 150 meV to ionize and the ratio of shallow level dopants to deep level dopants is between 1:1000 and 1000:1.

9. The semiconductor device of claim 1, wherein
    the first portions of the auxiliary structure and the collector structure form second pn junctions at room temperature.

10. The semiconductor device of claim 1, wherein
    the first portions of the auxiliary structure directly adjoin the second surface.

11. The semiconductor device of claim 1, wherein
    the first portions of the auxiliary structure and the collector structure form unipolar homojunctions at room temperature and pn junctions at a temperature of at least 100 degree Celsius.

12. The semiconductor device of claim 1, wherein
    the drift zone structure comprises a drift zone forming the first pn junction and a field stop zone directly adjoining the auxiliary structure, and
    a maximum dopant concentration/dose in the field stop zone is at least twice as high as a maximum dopant concentration/dose in the drift zone.

13. The semiconductor device of claim 12, wherein
    the field stop zone contains radiation-induced donors.

14. The semiconductor device of claim 1, wherein
    the first portions of the auxiliary structure are formed between the drift zone structure and the collector structure.

15. The semiconductor device of claim 14, wherein
    the collector structure comprises a pilot zone forming a pn junction with the first portion of the auxiliary structure and channel zones of a conductivity type of the drift zone structure, the channel zones extending between the second surface and the drift zone structure or between the second surface and the auxiliary structure.

16. The semiconductor device of claim 14, wherein
the collector structure is a contiguous collector layer with uniform doping profile parallel to the second surface at least in the transistor cell area.

17. The semiconductor device of claim 16, wherein
the auxiliary structure includes a plurality of the first portions spatially separated from each other.

18. The semiconductor device of claim 17, wherein
the auxiliary structure includes a plurality of second portions separating the first portions and a dopant concentration/dose of the deep level dopants in the first portions is at least 1.5 times as high as a dopant concentration/dose of the deep level dopants in the second portions.

19. The semiconductor device of claim 14, wherein
the collector structure comprises a plurality of separated enhanced emitter zones.

20. The semiconductor device of claim 19, wherein
the collector structure includes not-enhanced emitter zones between the enhanced emitter zones, and a mean net dopant concentration/dose in the enhanced emitter zones is at least 1.5 times as high as a mean net dopant concentration/dose in the non-enhanced emitter zones.

21. The semiconductor device of claim 19, wherein
the first portions of the auxiliary structure form a contiguous auxiliary layer with uniform doping profile parallel to the second surface at least in the transistor cell area.

22. The semiconductor device of claim 19, wherein
the auxiliary structure includes second portions separating the first portions from each other, and a deep level dopant concentration/dose in the first portions is at least 1.5 times as high as a deep level dopant concentration/dose in the second portions, and wherein the first portions of the auxiliary structure directly adjoin the enhanced emitter zones of the collector structure.

23. The semiconductor device of claim 22, wherein
the first portions of the auxiliary structure are formed in a, with respect to the second surface, vertical direction of the enhanced emitter zones of the collector structure.

24. An insulated gate bipolar transistor comprising:
transistor cells formed along a first surface at a front side of a semiconductor body in a transistor cell area;
a drift zone structure forming first pn junctions with body zones of the transistor cells;
an auxiliary structure between the drift zone structure and a second surface at a rear side of the semiconductor body, wherein at least a first portion of the auxiliary structure contains deep level dopants requiring at least 150 meV to ionize; and
a collector structure directly adjoining the auxiliary structure, wherein at least one of the auxiliary structure and collector structure having a dopant concentration that varies such that an injection efficiency of minority carriers from the collector structure into the drift zone structure varies along a direction parallel to the first surface at least in the transistor cell area.

25. A method of manufacturing a semiconductor device, the method comprising:
forming transistor cells at a front side of a semiconductor body, wherein a drift zone formed in the semiconductor body is effective as drain of the transistor cells;
forming a rear side structure at a rear side of the semiconductor body, the rear side structure including deep level dopants requiring at least 150 meV to ionize, and having a dopant concentration that varies such that minority carrier injection efficiency into the drift zone varies along a direction parallel to the front side at least in a transistor cell area.

* * * * *